United States Patent
Nojima

(10) Patent No.: US 11,242,482 B2
(45) Date of Patent: Feb. 8, 2022

(54) QUANTUM DOT, METHOD FOR PRODUCING THE SAME, RESIN COMPOSITION, WAVELENGTH CONVERSION MATERIAL, AND LIGHT EMITTING DEVICE

(71) Applicant: SHIN-ETSU CHEMICAL CO., LTD., Tokyo (JP)

(72) Inventor: Yoshihiro Nojima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 5 days.

(21) Appl. No.: 16/769,607

(22) PCT Filed: Nov. 6, 2018

(86) PCT No.: PCT/JP2018/041122
§ 371 (c)(1),
(2) Date: Jun. 4, 2020

(87) PCT Pub. No.: WO2019/111617
PCT Pub. Date: Jun. 13, 2019

(65) Prior Publication Data
US 2020/0317998 A1     Oct. 8, 2020

(30) Foreign Application Priority Data
Dec. 4, 2017  (JP) .............................. JP2017-232506

(51) Int. Cl.
| C09K 11/02 | (2006.01) |
| C08L 83/04 | (2006.01) |
| C09K 11/70 | (2006.01) |
| H01L 33/50 | (2010.01) |
| C09K 11/59 | (2006.01) |
| B82Y 20/00 | (2011.01) |
| B82Y 30/00 | (2011.01) |

(52) U.S. Cl.
CPC ............ *C09K 11/025* (2013.01); *C08L 83/04* (2013.01); *C09K 11/02* (2013.01); *C09K 11/59* (2013.01); *C09K 11/70* (2013.01); *H01L 33/50* (2013.01); *H01L 33/502* (2013.01); *B82Y 20/00* (2013.01); *B82Y 30/00* (2013.01)

(58) Field of Classification Search
CPC ....... C09K 11/025; C09K 11/02; H01L 33/50; H01L 33/502; B82Y 20/00; B82Y 30/00
See application file for complete search history.

(56) References Cited

U.S. PATENT DOCUMENTS

| 6,251,303 | B1 * | 6/2001 | Bawendi ................ | B82Y 15/00 |
| | | | | 252/301.4 R |
| 2007/0034833 | A1 * | 2/2007 | Parce ..................... | B82Y 30/00 |
| | | | | 252/301.36 |
| 2010/0059721 | A1 | 3/2010 | Pickett et al. | |
| 2010/0276638 | A1 | 11/2010 | Liu et al. | |
| 2013/0345458 | A1 | 12/2013 | Freeman et al. | |
| 2014/0275598 | A1 | 9/2014 | Freeman et al. | |
| 2015/0160401 | A1 | 6/2015 | Namekata et al. | |
| 2015/0228866 | A1 | 8/2015 | Daniels et al. | |
| 2015/0318421 | A1 | 11/2015 | Ono et al. | |
| 2016/0017099 | A1 * | 1/2016 | Furuta ................... | C08G 77/392 |
| | | | | 252/301.36 |
| 2018/0059442 | A1 * | 3/2018 | Youn .................... | C09K 11/883 |
| 2018/0079868 | A1 | 3/2018 | Yamada et al. | |
| 2018/0366674 | A1 | 12/2018 | Sasaki | |
| 2019/0144689 | A1 | 5/2019 | Yamada et al. | |

FOREIGN PATENT DOCUMENTS

| JP | 2009-544805 A | 12/2009 |
| JP | 2011-528624 A | 11/2011 |
| JP | 2012-525467 A | 10/2012 |
| JP | 2014-127563 A | 7/2014 |
| JP | 2015-111518 A | 6/2015 |
| JP | 2015-523439 A | 8/2015 |
| JP | 2016-521251 A | 7/2016 |
| JP | 2017-513960 A | 6/2017 |
| JP | 2017-529411 A | 10/2017 |
| JP | 2018-153915 A | 10/2018 |
| WO | 2016/189869 A1 | 12/2016 |
| WO | 2016/195188 A1 | 12/2016 |
| WO | 2017/086362 A1 | 5/2017 |
| WO | WO 2017/086362 * | 5/2017 |
| WO | 2017/150297 A1 | 9/2017 |
| WO | WO 2017/150297 * | 9/2017 |
| WO | 2018/016589 A1 | 1/2018 |
| WO | WO 2018/224599 * | 12/2018 |

OTHER PUBLICATIONS

Jan. 29, 2019 International Search Report issued in International Patent Application No. PCT/JP2018/041122.
Jun. 9, 2020 International Preliminary Report on Patentability issued in International Patent Application No. PCT/JP2018/041122.
Mar. 2, 2021 Office Action issued in Japanese Patent Application No. 2017-232506.

\* cited by examiner

*Primary Examiner* — C Melissa Koslow
(74) *Attorney, Agent, or Firm* — Oliff PLC

(57) ABSTRACT

A quantum dot including a semiconductor crystal particle having a particle diameter of 20 nm or less, and a ligand having two or more functional groups for interaction with the semiconductor crystal particle coordinates to two or more sites on a surface of the semiconductor crystal particle. A quantum dot with enhanced stability through surface modification on the semiconductor crystal particle by using a ligand which has two or more functional groups for interaction with the semiconductor crystal particle, and which coordinates to two or more sites on the semiconductor particle surface.

6 Claims, No Drawings

QUANTUM DOT, METHOD FOR PRODUCING THE SAME, RESIN COMPOSITION, WAVELENGTH CONVERSION MATERIAL, AND LIGHT EMITTING DEVICE

TECHNICAL FIELD

The present invention relates to a quantum dot, a method for producing the quantum dot, a resin composition, a wavelength conversion material, and a light emitting device.

BACKGROUND ART

In quantum dots including semiconductor crystal particles with nanosized particle diameters, excitons generated upon light absorption are confined in a nanosized region, so that the semiconductor crystal particles have discrete energy levels, while the band gap varies depending on particle diameter. Due to these effects, the fluorescence by quantum dots is brighter and more efficient than those by common fluorescent materials and exhibits sharp light emission. Moreover, based on such nature that the band gap varies depending on the particle diameter, quantum dots are characterized in that the emission wavelength is controllable. The applications as wavelength conversion materials for solid-state lighting and displays are expected (Patent Document 1).

However, semiconductor crystal particles having particle diameters as small as nanometer size have large specific surface area and high surface energy. The surfaces are highly active and likely to become unstable. Hence, surface defects such as oxidation reaction and dangling bonds are likely to occur on the surfaces, consequently degrading the fluorescence properties. Currently-available quantum dots have stability problem, and the luminous properties are sometimes adversely influenced by heat, humidity, light excitation, also aggregation in a dispersion medium, etc. Meanwhile, for use in wavelength conversion material or the like, quantum dots dispersed in a resin or the like are used. However, it is known that quantum dots aggregate in a resin and the stability is lowered, so that the luminous properties are degraded.

Against such problems, methods have been studied in which the surface of quantum dot is coated with a polymer, an inorganic oxide, or the like in order to enhance the stability.

Nevertheless, in such a step of coating quantum-dot surface to enhance the stability, the luminous properties of the quantum dots cannot be maintained, resulting in a problem of property degradation.

CITATION LIST

Patent Literature

Patent Document 1: Japanese Unexamined Patent Application Publication No. 2015-111518

SUMMARY OF INVENTION

Technical Problem

The present invention has been made in view of the problems as described above. An object of the present invention is to provide a quantum dot with enhanced stability through surface modification on the semiconductor crystal particle.

Solution to Problem

To achieve the object, the present invention provides a quantum dot comprising a semiconductor crystal particle having a particle diameter of 20 nm or less, wherein a ligand having two or more functional groups for interaction with the semiconductor crystal particle coordinates to two or more sites on a surface of the semiconductor crystal particle.

By modifying the surface of the semiconductor crystal particle as described above, the quantum dot has higher stability.

Additionally, the surface of the quantum dot may be further coated with an inorganic oxide.

In this manner, further coating with an inorganic oxide enhances the stability and the compatibility with a resin to higher extents.

Moreover, the surface of the quantum dot may be further coated with a polymer.

In this manner, further coating with a polymer enhances the stability and the compatibility with a resin to higher extents.

The present invention also provides a resin composition comprising at least one of the above-described quantum dots dispersed in a resin.

Such a resin composition contains stable quantum dot and is suitably usable as a wavelength conversion material, for example.

The present invention further provides a wavelength conversion material comprising a cured product of the above-described resin composition.

Such a wavelength conversion material has higher reliability.

The present invention further provides a light emitting device comprising the wavelength conversion material.

In a light emitting device using the wavelength conversion material as described above, the quantum dot is stable, so that the reliability is particularly excellent.

Moreover, the present invention provides a method for producing a quantum dot comprising a semiconductor crystal particle having a particle diameter of 20 nm or less, the method comprising a step of surface-treating the semiconductor crystal particle with a ligand which has two or more functional groups for interaction with the semiconductor crystal particle, and which coordinates to two or more sites on the semiconductor crystal particle.

Such a method makes it possible to produce a quantum dot having enhanced stability.

Furthermore, the present invention provides a method for producing a quantum dot comprising a semiconductor crystal particle having a particle diameter of 20 nm or less, the method comprising substituting a ligand present on a surface of the semiconductor crystal particle with a ligand which has two or more functional groups for interaction with the semiconductor crystal particle, and which coordinates to two or more sites on the semiconductor crystal particle.

A quantum dot having enhanced stability can be produced according to this method, too.

Advantageous Effects of Invention

As described above, the inventive quantum dot has enhanced stability. Moreover, a resin composition containing the inventive quantum dot dispersed in a resin is suitably usable as a wavelength conversion material, and the wavelength conversion material using a cured product of this resin composition is more reliable. Further, a light emitting device using the wavelength conversion material has particularly excellent reliability.

DESCRIPTION OF EMBODIMENTS

As described above, it has been desired to enhance the stability of quantum dots so as to enhance the reliability as a wavelength conversion material. Hence, there have been demands for the development of such quantum dot having enhanced stability.

The present inventor and colleagues have earnestly studied the above-described problems. As a result, the inventor has conceived that the stability of quantum dot is improved by disposing the following ligand on the surface of a semiconductor crystal particle.

Specifically, the ligand has two or more functional groups for interaction with the semiconductor crystal particle, and is capable of coordinating at two or more sites (hereinafter, the ligand may also be referred to as chelating ligand). Thus, the present invention has been completed.

Specifically, the present invention is a quantum dot comprising a semiconductor crystal particle having a particle diameter of 20 nm or less, wherein a ligand having two or more functional groups for interaction with the semiconductor crystal particle coordinates to two or more sites on a surface of the semiconductor crystal particle.

In the present invention, the composition and production method of the semiconductor crystal particle are not particularly limited, and the semiconductor crystal particle can be selected in accordance with the purpose.

Moreover, the semiconductor crystal particle may have only a core, or may have a core-shell structure. The structure of the semiconductor crystal particle is not limited and can be appropriately selected. Examples of the semiconductor crystal particle as a core include CdTe, PbS, etc. Examples of the core-shell structure of the semiconductor crystal particle include InP/ZnS, CdSe/ZnS, etc.

Further, the semiconductor crystal particle may be spherical, cubic, or rod shaped. The shape of the semiconductor crystal particle is not limited and can be selected freely.

In the present invention, the average particle diameter of the semiconductor crystal particles is 20 nm or less. If the average particle diameter exceeds 20 nm, the quantum size effect is not obtained, the luminous efficiency is considerably decreased, or the band gap cannot be controlled through particle diameter adjustment.

The particle diameters of semiconductor crystal particles can be calculated from an average value of maximum diameters in a specified direction, that is, Feret diameters, of 20 particles or more which are measured from a particle image taken with a transmission electron microscope (TEM). It is a matter of course that the measurement method of the average particle diameter is not limited thereto, and the measurement can be performed by other methods.

Moreover, in the present invention, a chelating ligand coordinates to the semiconductor crystal particle surface.

The chelating ligand has two or more functional groups for interaction with the semiconductor crystal particle. The chelating ligand coordinates to two or more sites and is present on the surface of the semiconductor crystal particle.

Here, the functional groups which interact with the semiconductor crystal particle are not particularly limited, and can be selected appropriately in accordance with the purpose. Examples of the functional groups include a carboxyl group, a phosphate group, a thiol group, a sulfonic acid group, an amino group, an imine group, an imide group, an amide group, etc.

The two or more functional groups may be identical to each other, or two or more different types of functional groups may exist. Alternatively, the functional groups may have such a form that neighboring functional groups are condensed like acid anhydride. Nevertheless, all of these functional groups have a steric configuration enabling the coordination to the semiconductor crystal particle, and need to coordinate at two or more sites.

Moreover, as the chelating ligand, cyclic ligands such as crown ethers, porphyrins, and derivatives thereof are also suitably used.

Examples of the ligand as described above include sodium N,N-diethyldithiocarbamate trihydrate, [3-(trimethylsilyl)propyl]succinic anhydride, salen, dithizone, etc. Further, examples of the cyclic ligands include phthalocyanine, tetrakis(4-carboxyphenyl)porphyrin, 5-(4-carboxyphenyl)-10,15,20-triphenylporphyrin, 1-aza-18-crown-6-ether, 1,4,7,10,13,16-hexaazacyclooctadecane, 1,4,8,11-tetrathiacyclotetradecane, etc.

As described above, by disposing the chelating ligand on the surface of the semiconductor crystal particle, a stable quantum dot is obtained.

Further, while the ligand is disposed on the inventive quantum dot, a layer of an inorganic oxide or a polymer can be formed by utilizing, as a reaction point, another functional group which the ligand has, but which is different from the functional groups coordinating to the semiconductor crystal particle. Additionally forming such a layer(s) on the surface of the quantum dot makes it possible to further enhance the stability and the compatibility with a resin.

The compositions and production methods of the inorganic oxide layer and the polymer layer are not particularly limited, and can be selected appropriately in accordance with the purpose.

Examples of the inorganic oxide layer include silicon oxide, zinc oxide, aluminum oxide, zirconium oxide, titanium oxide, cerium oxide, etc.

Examples of the polymer layer include polysilsesquioxane, poly (methyl methacrylate), polyacrylonitrile, polyethylene glycol, etc.

The inorganic oxide layer can be formed by adding a metal alkoxide such as tetraethoxysilane or aluminum isopropoxide, or an organometallic complex such as zirconium acetylacetone, to a quantum dot solution for the reaction with the functional group of the chelating ligand disposed on the surface of the semiconductor crystal particle.

The polymer layer can also be formed by the reaction between a functional group in the polymer and the functional group of the chelating ligand disposed on the surface of the semiconductor crystal particle. Alternatively, the polymer layer can be formed by polymerization at the functional group, as a reaction point, of the chelating ligand disposed on the surface of the semiconductor crystal particle.

When such reactions are carried out, a ligand such as trioctylphosphine, trioctylphosphine oxide, hexadecylamine, octylamine, palmitic acid, or myristic acid is separated from common quantum dots by the influence of reaction conditions such as catalyst, temperature, and side reaction in the above-described reactions. As a result, dangling bonds are increased on the semiconductor crystal particle surface, and aggregation occurs. These lower the luminous properties and shift the emission wavelength. In contrast, the inventive quantum dot has the ligand stably disposed on the surface of the semiconductor crystal particle. This makes it possible to suppress such degradation in luminous properties.

The thicknesses of the inorganic oxide layer and the polymer layer are not particularly limited. Nevertheless, if the quantum dot coated with the inorganic oxide layer or the polymer layer has a particle diameter of more than 100 nm, the dispersibility is lowered, so that the aggregation is likely to occur. For this reason, the inorganic oxide layer and the polymer layer desirably have such a thickness that the quantum dot coated therewith has a particle diameter of less than 100 nm.

The present invention further provides a resin composition containing the above-described quantum dot dispersed in a resin.

The inventive quantum dot is mixed with a resin and thereby dispersed in the resin. In this process, the quantum dot dispersed in a solvent can be added to and mixed with a resin for the dispersion in the resin. Meanwhile, after the solvent is removed, the quantum dot in a powder form can be added to and kneaded with a resin for the dispersion in the resin. As an alternative method, a constituent monomer or oligomer of such a resin is polymerized in the co-presence of the quantum dot. The method of dispersing the quantum dot into a resin is not particularly limited, and can be selected appropriately depending on the purpose.

The solvent where the quantum dot is dispersed is not particularly limited, as long as the solvent is compatible with the resin. Moreover, the resin material is not particularly limited, and a silicone resin, an acrylic resin, an epoxy resin, a urethane resin, or the like can be selected appropriately in accordance with desired properties. The transmittance of these resins is desirably high so as to enhance the efficiency as a wavelength conversion material. The transmittance is particularly desirably 80% or more.

Such a resin composition in which the inventive quantum dot is dispersed in a resin is suitably usable for a wavelength conversion material described below.

The present invention further provides a wavelength conversion material using a cured product of the above-described resin composition. In the present invention, the quantum dots are stable and uniformly dispersed. This makes the wavelength conversion material highly efficient.

The method for preparing the inventive wavelength conversion material is not particularly limited, and can be selected appropriately according to the purpose.

For example, the wavelength conversion material can be obtained by: dispersing the quantum dot in a resin; applying the resulting resin composition to a transparent film such as PET or polyimide; and curing the resultant, followed by lamination process.

For the application to the transparent film, it is possible to employ a spray method with a spray, inkjet, or the like, or a method with a spin coater, bar coater, or doctor blade. By these applications, a resin layer is formed. Additionally, the thicknesses of the resin layer and the transparent film are not particularly limited, and can be selected appropriately depending on the usage.

The method for curing the resin composition is not particularly limited. For example, the film to which the resin composition has been applied can be heated at 60° C. for 2 hours, and then heated at 150° C. for 4 hours.

Such a wavelength conversion material has enhanced reliability.

Further, the present invention provides a light emitting device using the wavelength conversion material.

The light emitting device is not particularly limited. Examples thereof include light-emitting diodes, etc.

In such a light emitting device using the inventive wavelength conversion material, the quantum dot is so stable that the reliability is particularly excellent.

Moreover, the present invention provides a method for producing a quantum dot including a semiconductor crystal particle having a particle diameter of 20 nm or less, the method including a step of surface-treating the semiconductor crystal particle with a ligand which has two or more functional groups for interaction with the semiconductor crystal particle, and which coordinates to two or more sites on the semiconductor crystal particle.

In the treatment method with the ligand, for example, an organic solvent used in producing the semiconductor crystal particle may be used, and this organic solvent contains the above-described ligand.

Furthermore, the present invention provides a method for producing a quantum dot including a semiconductor crystal particle having a particle diameter of 20 nm or less, the method including substituting a ligand present on a surface of the semiconductor crystal particle with a ligand which has two or more functional groups for interaction with the semiconductor crystal particle, and which coordinates to two or more sites on the semiconductor crystal particle.

As the ligand substitution method, for example, semiconductor crystal particles having a ligand coordinating thereto and the ligand used in the present invention may be stirred in a solvent for ligand exchange.

These production methods make it possible to produce the inventive quantum dot having enhanced stability.

EXAMPLE

Hereinafter, the present invention will be specifically described by way of Examples and Comparative Examples, but the present invention is not limited thereto.

Note that, in the following Examples and Comparative Examples, the fluorescence properties of quantum dots and wavelength conversion materials were evaluated with a spectrofluorometer (Fluorolog-3 manufactured by HORIBA, Ltd.) by measuring the emission wavelengths and internal quantum efficiencies of the quantum dots and the wavelength conversion materials with an excitation wavelength set at 450 nm.

Example 1

InP/ZnS core-shell semiconductor crystal particles (emission wavelength: 534 nm, internal quantum efficiency: 62%) having spherical shape and particle diameters of 6 nm were used to prepare a dispersion in toluene with a semiconductor crystal particle concentration of 1.0 wt % for use. As a ligand, palmitic acid coordinated to the semiconductor crystal particle surfaces.

(Step 1)

To 10 mL of this toluene solution containing 1 wt % of the semiconductor crystal particles, 5 wt % of [3-(trimethylsilyl)propyl]succinic anhydride was added and stirred for 6 hours.

(Step 2)

To this solution, acetone was added in an excess amount. After the semiconductor crystal particles were precipitated, the solid was collected with a centrifuge.

(Step 3)

The collected solid was dispersed again in 10 mL of toluene. As in Step 1, 2 wt % of [3-(trimethylsilyl)propyl] succinic anhydride was added and stirred for 6 hours.

(Step 4)

As in Step 2, acetone was added in an excess amount. After the semiconductor crystal particles were precipitated, the solid was collected with a centrifuge.

(Step 5)

The collected solid was dispersed again in toluene. In the manner described above, quantum dots were obtained in which [3-(trimethylsilyl)propyl]succinic anhydride was disposed on the surfaces of the semiconductor crystal particles.

The luminous properties of the quantum dot solution thus obtained were checked with the spectrofluorometer. The emission wavelength was 534 nm and did not change. The internal quantum efficiency was 61% and hardly changed.

Example 2

To a solution in which 100 mL of cyclohexane had been mixed with 1.0 g of polyoxyethylene (5) nonylphenyl ether (IGEPAL-00520 manufactured by Rhodia S.A.), 1.0 mL of tetraethoxysilane was added and vigorously stirred. Under this condition, 3.0 mL of the solution containing the semiconductor crystal particles obtained in Step 1 was added dropwise. Without interrupting the stirring, 5 mL of 10% ammonia water was added dropwise little by little and stirred for 20 hours. After the stirring, quantum dots having an $SiO_2$ layer thereon were obtained by centrifugation.

The obtained $SiO_2$-coated quantum dots were dispersed in ethanol, and the particle diameters were checked using a particle size analyzer (ELSZ-2000ZS manufactured by Otsuka Electronics Co., Ltd.). The particle diameters were 56 nm according to the dynamic light scattering method. Moreover, the TEM observation showed that the particles had spheroid shape and the average particle diameter was 48 nm.

The luminous properties of the $SiO_2$-coated quantum dots were checked with the spectrofluorometer. The emission wavelength was 535 nm and did not change. The internal quantum efficiency was 56%, and the emission intensity was not decreased greatly.

Example 3

The $SiO_2$-coated quantum dots obtained in Example 2 were used to prepare a wavelength conversion material.

First, 1.0 g of an alcohol solution containing 1.0 wt % of the $SiO_2$-coated quantum dots was mixed with 10.0 g of a silicone resin (LPS-5547 manufactured by Shin-Etsu Chemical Co., Ltd.) and stirred and heated at 50° C. Under this condition, the solvent was removed under reduced pressure. Then, the resultant was subjected to vacuum degassing and applied onto a polyethylene terephthalate (PET) film with a thickness of 50 μm. A quantum dot resin layer having a thickness of 100 μm was formed using a bar coater. Further, a PET film was laminated on this resin layer for the lamination process. The films were heated at 60° C. for 2 hours, and then heated at 150° C. for 4 hours to cure the quantum dot resin layer.

The emission wavelength of the obtained wavelength conversion material was 535 nm and did not change. The internal quantum efficiency was 50%.

Comparative Example 1

The semiconductor crystal particles not subjected to the treatment (Steps 1 to 5) in Example 1 were used to prepare $SiO_2$-coated quantum dots by the same procedure as in Example 2 without performing Steps 1 to 5.

To a solution in which 100 mL of cyclohexane had been mixed with 1.0 g of polyoxyethylene (5) nonylphenyl ether (IGEPAL-00520 manufactured by Rhodia S.A.), 1.0 mL of tetraethoxysilane was added and vigorously stirred. Under this condition, 3.0 mL of a solution containing the semiconductor crystal particles was added dropwise. Without interrupting the stirring, 5 mL of 10% ammonia water was added dropwise little by little and stirred for 20 hours. After the stirring, quantum dots having an $SiO_2$ layer thereon were obtained by centrifugation.

The obtained $SiO_2$-coated quantum dots were dispersed in ethanol, and the particle diameters were checked using a particle size analyzer (ELSZ-2000ZS manufactured by Otsuka Electronics Co., Ltd.). The particle diameters were 60 nm according to the dynamic light scattering method. Moreover, the TEM observation showed that the particles had spheroid shape and the average particle diameter was 55 nm.

The luminous properties of the $SiO_2$-coated quantum dots were checked with the spectrofluorometer. The emission wavelength was 541 nm, and the emission wavelength was shifted to a longer wavelength. The internal quantum efficiency was 29%, indicating that the emission intensity was decreased.

Comparative Example 2

The $SiO_2$-coated quantum dots obtained in Comparative Example 1 were used to prepare a wavelength conversion material.

First, 1.0 g of an alcohol solution containing 1.0 wt % of the $SiO_2$-coated quantum dots was mixed with 10.0 g of a silicone resin (LPS-5547 manufactured by Shin-Etsu Chemical Co., Ltd.) and stirred and heated at 50° C. Under this condition, the solvent was removed under reduced pressure. Then, the resultant was subjected to vacuum degassing and applied onto a polyethylene terephthalate (PET) film with a thickness of 50 μm. A quantum dot resin layer having a thickness of 100 μm was formed using a bar coater. Further, a PET film was laminated on this resin layer for the lamination process. The films were heated at 60° C. for 2 hours, and then heated at 150° C. for 4 hours to cure the quantum dot resin layer.

The emission wavelength of the obtained wavelength conversion material was further changed to 552 nm. The internal quantum efficiency was 9% and greatly decreased.

As noted above, in Example 1 to 3, the emission wavelengths did not change, and the internal quantum efficiencies did not decreased, either. These verified that the inventive quantum dots are stable. Meanwhile, in Comparative Examples 1 and 2 using the quantum dots in which the ligand did not coordinate to two or more sites on the surfaces of the semiconductor crystal particles, the emission wavelengths were shifted to a longer wavelength, and the internal quantum efficiencies were considerably decreased. These verified that the comparative quantum dots are unstable.

The foregoing demonstrated that the inventive quantum dots are stable and the wavelength conversion material using the inventive quantum dots has high reliability.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A quantum dot comprising a semiconductor crystal particle having a particle diameter of 20 nm or less, wherein
a ligand having two or more functional groups for interaction with the semiconductor crystal particle coordinates to two or more sites on a surface of the semiconductor crystal particle,
the surface of the quantum dot is further coated with a polymer, and
the polymer is polysilsesquioxane, poly (methyl methacrylate), polyacrylonitrile or polyethylene glycol.

2. A resin composition comprising the quantum dot according to claim 1 dispersed in a resin.

3. A wavelength conversion material comprising a cured product of the resin composition according to claim 2.

4. A light emitting device comprising the wavelength conversion material according to claim 3.

5. A method for producing a quantum dot comprising a semiconductor crystal particle having a particle diameter of 20 nm or less, the method comprising a step of surface-treating the semiconductor crystal particle with a ligand which has two or more functional groups for interaction with the semiconductor crystal particle, and which coordinates to two or more sites on the semiconductor crystal particle, and
a step of forming a polymer layer by utilizing, as a reaction point, another functional group which the ligand has, but which is different from the functional groups coordinating to the semiconductor crystal particle, wherein
the polymer layer is polysilsesquioxane, poly (methyl methacrylate), polyacrylonitrile or polyethylene glycol.

6. A method for producing a quantum dot comprising a semiconductor crystal particle having a particle diameter of 20 nm or less, the method comprising substituting a ligand present on a surface of the semiconductor crystal particle with a ligand which has two or more functional groups for interaction with the semiconductor crystal particle, and which coordinates to two or more sites on the semiconductor crystal particle, and
forming a polymer layer by utilizing, as a reaction point, another functional group which the ligand has, but which is different from the functional groups coordinating to the semiconductor crystal particle, wherein
the polymer layer is polysilsesquioxane, poly (methyl methacrylate), polyacrylonitrile or polyethylene glycol.

* * * * *